United States Patent [19]
Kimura

[11] Patent Number: 5,679,497
[45] Date of Patent: Oct. 21, 1997

[54] RESIST MATERIAL AND METHOD FOR FORMING RESIST PATTERN

[75] Inventor: Yoshika Kimura, Hyogo, Japan

[73] Assignee: Mitsubishi Denki Kabushiki Kaisha, Tokyo, Japan

[21] Appl. No.: 783,769

[22] Filed: Jan. 15, 1997

Related U.S. Application Data

[63] Continuation of Ser. No. 569,696, Dec. 8, 1995, abandoned.

[30] Foreign Application Priority Data

Mar. 24, 1995 [JP] Japan ................................ 7-65814

[51] Int. Cl.$^6$ ................................................ G03C 5/00
[52] U.S. Cl. .................... 430/296; 430/270.1; 430/325; 430/326; 430/330; 430/942
[58] Field of Search ........................... 430/296, 270.1, 430/325, 326, 330, 942

[56] References Cited

FOREIGN PATENT DOCUMENTS

| | | |
|---|---|---|
| 3-142918 | 6/1991 | Japan . |
| 3-218005 | 9/1991 | Japan . |
| 4-177738 | 6/1992 | Japan . |
| 4-186639 | 7/1992 | Japan . |
| 4-186641 | 7/1992 | Japan . |
| 4-363014 | 12/1992 | Japan . |
| 5-129196 | 5/1993 | Japan . |
| 5-323590 | 12/1993 | Japan . |
| 5-323610 | 12/1993 | Japan . |
| 6-43653 | 2/1994 | Japan . |

*Primary Examiner*—Geraldine Letscher
*Attorney, Agent, or Firm*—Lowe, Price, LeBlanc & Becker

[57] ABSTRACT

A resist material and a method for forming a resist pattern can be obtained which can improve throughput of pattern formation using both EB lithography and optical beam lithography and which does not suffer from degradation of an alignment mark. This resist material includes a first acid generating agent having a sensitivity only to an EB and a second acid generating agent having a sensitivity to an optical beam. A desired resist pattern is formed by the steps of exposing the resist material to the EB and exposing the resist material to the optical beam.

17 Claims, 9 Drawing Sheets

14:RESIST MATERIAL

III:PORTION TO BE PATTERNED USING EB LITHOGRAPHY

14a:RESIST MATERIAL

IV:PORTION TO BE PATTERNED USING OPTICAL BEAM LITHOGRAPHY 14a,14b:RESIST MATERIAL
20:PHOTOMASK
17:OPTICAL BEAM

14c:RESIST MATERIAL

14d:RESIST MATERIAL

14e:RESIST MATERIAL

14f:RESIST MATERIAL

RESIST MATERIAL AND METHOD FOR FORMING RESIST PATTERN

This application is a continuation of application Ser. No. 08/569,696 filed Dec. 8, 1995, now abandoned.

BACKGROUND OF THE INVENTION

1. Field of the Invention

The present invention relates to a resist material and a method for forming a resist pattern which can correspond to both electron beam lithography and optical beam lithography.

2. Description of the Background Art

When fine patterning is carried out in a conventional semiconductor device, an electron beam (hereinafter referred to as an "EB") must be used for a region which cannot be resolved by an optical beam. Therefore, a resist pattern was formed with EB lithography. However, if such a resist material as was used in optical beam lithography heretofore is used in forming a resist pattern with the EB lithography, the resist material has a low sensitivity to the EB, resulting in reduction of throughput. Therefore, in order to increase throughput, a resist material having a high sensitivity to the EB is currently used.

FIGS. 7A to 7F show the steps of a conventional method for forming a resist pattern with the EB lithography. The conventional method for forming a resist pattern will be described hereinafter also with reference to FIGS. 8, 9A to 9C and 10. First, a resist material 2 is applied onto a substrate 1, and prebaked (FIG. 7A). Resist material 2 is prepared from an acid-decayed type resin 3 of a polymer principal chain 3a and a protecting group 3b (insoluble in a developer) and, as shown at A in FIG. 8, an acid generating agent 4. Then, resist material is exposed to an EB5 with a predetermined pattern (FIG. B). The amount of exposure at this time is within a range of a sensitivity of the resist material to the EB when such acid generating agent 4 as shown in FIG. 10 is used, that is, within a range I of a region in which a pattern can be formed. In a portion 2a exposed to EB5 with this amount of exposure, Bronsted acid 6 is generated from acid generating agent 4 as shown at B of FIG. 8.

After being subjected to a post exposure baking treatment (hereinafter referred to as a "PEB treatment"), resist material 2a reacted by EB exposure is changed to resist material 2b which is soluble in the developer (FIG. 7C). More specifically, as shown at C in FIG. 8, acid-decayed type resin 3 of resist material 2 is acid-decayed by Brønsted acid 6, and protecting group 3b is released to be changed into a substituent 3c soluble in the developer. As a result, acid-decayed type resin 3 is changed into a resin 7 which is soluble in the developer, as shown in FIG. 9B. Then, resist material 2 is developed in the developer, resist material 2b which is soluble in the developer is removed, and patterned resist material 2c is formed (FIG. 7D).

Then, patterned resist material 2c is exposed to EB5 with the amount of exposure within a range larger than such a range of a sensitivity of the resist material to the EB as shown in FIG. 10, that is, the amount of exposure within a region II which can make the resist material negative (FIG. 7E). In a portion 2d exposed to EB5, Brønsted acid 6 is generated from acid generating agent 4 as shown at B in FIG. 8. When the resist material is subjected to the PEB treatment, resist material 2d reacted by EB exposure is changed into resist material 2e which is made negative (FIG. 7F). Although Brønsted acid 6 is generated from acid generating agent 4 similarly to the case of the above described patterning, the larger amount of exposure to EB5 at this time increases the amount of generation of Brønsted acid 6, causing a bridge reaction as a competitive reaction with the release of the protecting group, as shown at D in FIG. 8. This is the reason why the resist material is changed into such a resin 8 which is made negative as shown in FIG. 9C. The etching resistance of the resist material in the later steps is thus improved.

Registration of an alignment mark in the above described EB direct lithography is carried out using an EB10 after resist material 2 is applied onto substrate 1 as shown in FIG. 11A. Therefore, a portion in which resist material 2 on an alignment mark 9 is scanned by EB10 as shown in FIG. 11A is patterned in the step of the above described EB direct lithography. Alignment mark 9 is etched in the later etching step, to be degraded as shown in FIG. 11B.

When fine patterning is required in the conventional method for forming a resist pattern with conventional resist material 2, only the EB lithography can be used. Even if the sensitivity of resist material 2 itself to EB5 is enhanced to improve the throughput, the throughput is still lower than the case of the optical beam lithography. Further, in the EB lithography, the alignment mark is degraded due to EB scanning or the like.

SUMMARY OF THE INVENTION

One object of the present invention is to provide a resist material to which both EB lithography and optical beam lithography can be applied.

Another object of the present invention is to provide a method for forming with the resist material a resist pattern which can improve throughput and which does not suffer from degradation of an alignment mark.

A resist material according to one aspect of the present invention includes a first acid generating agent having a sensitivity only to an EB, and a second acid generating agent having a sensitivity to an optical beam.

The resist material is prepared from an acid-decayed type resin and first and second acid generating agents, or an acid-decayed type resin, an acid-decayed type dissolution inhibitor, and first and second acid generating agents.

The resist material is reacted with the EB and the optical beam at a high sensitivity.

In the resist material, the acid-decayed type resin or the acid-decayed type resin and the acid-decayed type dissolution inhibitor are reacted with the first and second acid generating agents.

A method for forming a resist pattern according to another aspect of the present invention includes the steps of applying a resist material onto a substrate, exposing the resist material of a portion to be patterned using EB lithography to an EB with the amount of exposure within a range of a sensitivity of a first acid generating agent to the EB, exposing the resist material to an optical beam within a range of a sensitivity of a second acid generating agent to the optical beam with a photomask masking the entire portion to be patterned using the EB lithography as well as a predetermined portion of a portion to be patterned using optical beam lithography, and developing the resist material exposed to the EB and the optical beam after a PEB treatment.

The method for forming a resist pattern includes the step of carrying out the PEB treatment after exposing the developed resist material to the optical beam with the amount of exposure greater than that within the range of a sensitivity of the second acid generating agent to the optical beam.

A method for forming a resist pattern according to still another aspect of the present invention includes the steps of applying a resist material onto a substrate, exposing the resist material to an EB with the amount of exposure within a range of a sensitivity of a first acid generating agent to the EB to be patterned into a predetermined pattern, and then subjecting the resist material to a PEB treatment to further develop the resist material, and exposing the developed resist material to an optical beam with the amount of exposure greater than that within a range of a sensitivity of a second acid generating agent to the optical beam, and then subjecting the resist material to the PEB treatment.

A method for forming a resist pattern according to a further aspect of the present invention includes the steps of applying a resist material onto a substrate, carrying out registration of an alignment mark formed on the substrate using an EB, exposing the resist material to the EB with the amount of exposure within a range of a sensitivity of a first acid generating agent to the EB to be patterned into a predetermined pattern, exposing the resist material to an optical beam with the amount of exposure greater than that within a range of a sensitivity of a second acid generating agent to the optical beam using a photomask exposing the alignment mark, and developing the resist material exposed to the EB and the optical beam after a PEB treatment.

As a result, the portion to be patterned using the EB lithography and the portion to be patterned using the optical beam lithography are formed with both EB exposure and optical exposure, respectively.

The bridge reaction is promoted as compared to the case where the resist material of the portion to be patterned using the EB lithography is exposed to the optical beam to form a pattern, resulting in improvement in the etching resistance in the later steps.

Further, the bridge reaction is promoted as compared to the case where the resist material on the alignment mark is exposed to the optical beam to form a pattern, resulting in improvement in the etching resistance in the later steps.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiment 1

Figure 1:
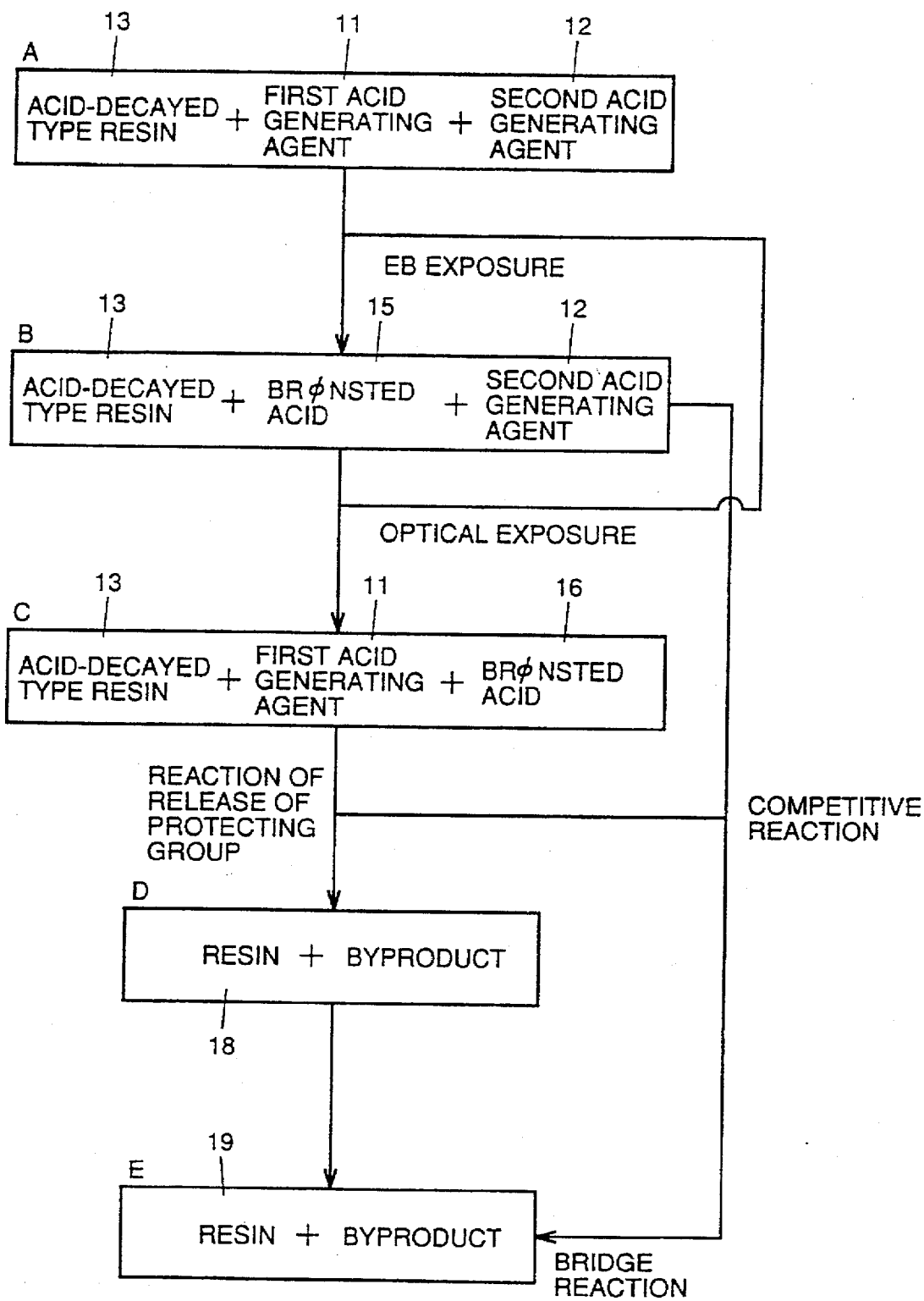
FIG. 1 is a diagram for describing change of a resist material caused by an EB and an optical beam according to Embodiment 1 of the present invention.
Figure 2A:
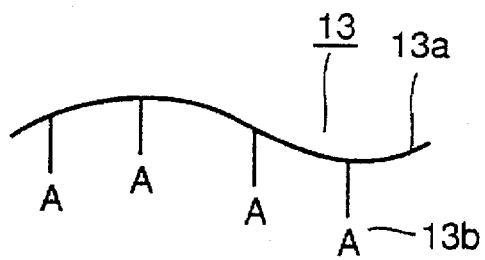
FIGS. 2A and 2B are diagrams showing structures of an acid-decayed type resin.
Figure 2B:
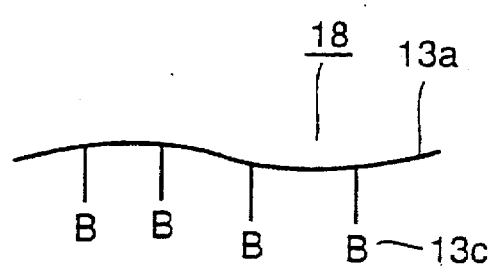
Figure 2C:
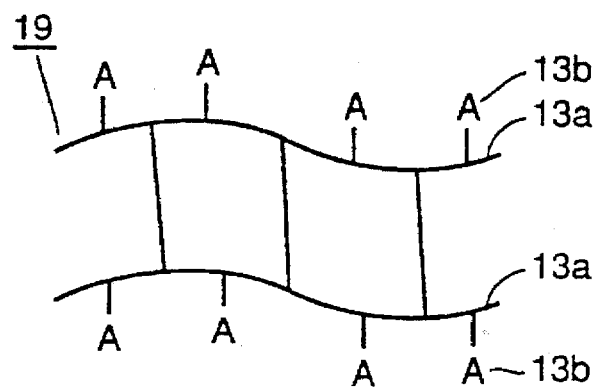
FIG. 2C is a diagram showing a structure of a resin which is made negative shown in FIG. 1.
Figure 3:
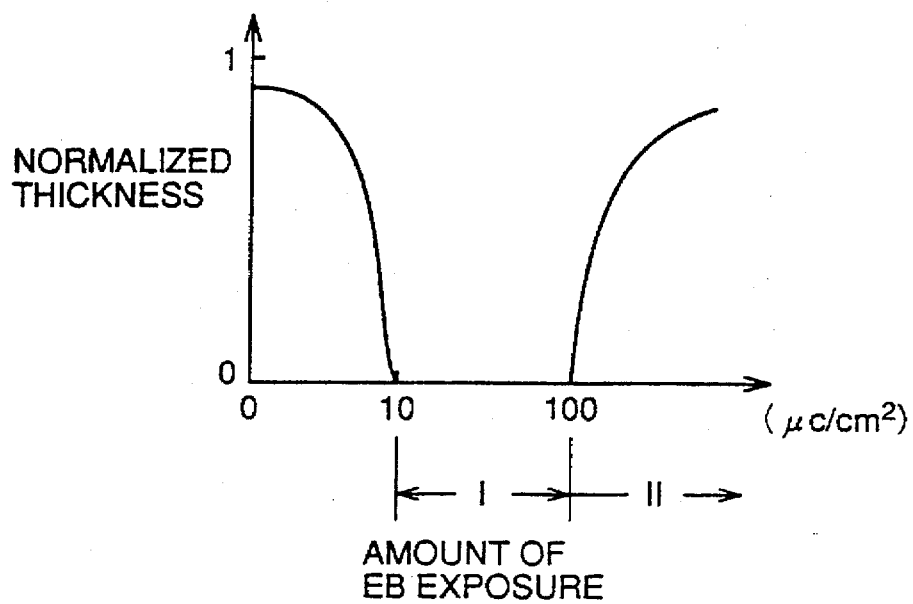
FIG. 3 is a diagram showing a sensitivity curve of the resist material to EB exposure when a first acid generating agent is used according to Embodiment 1 of the present invention.
Figure 4:
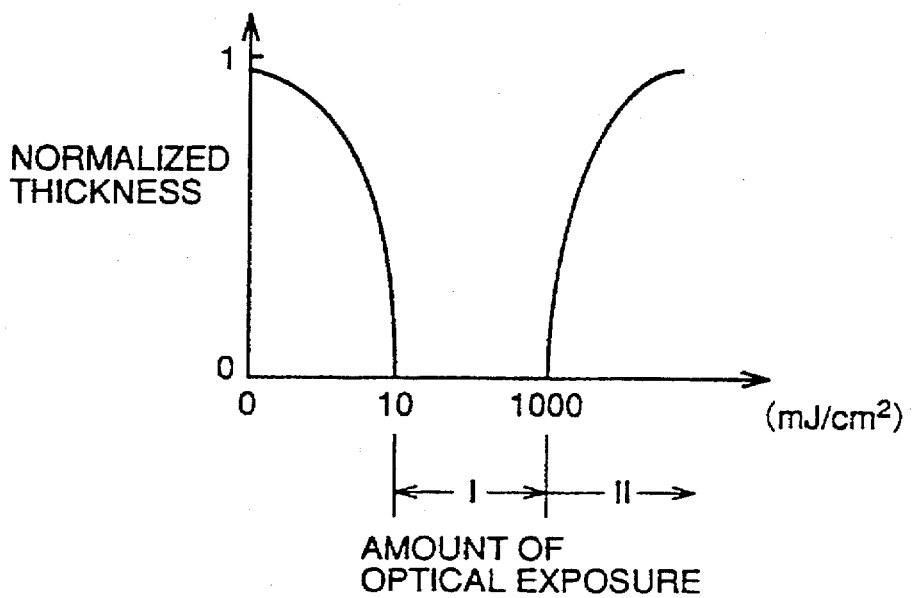
FIG. 4 is a diagram showing a sensitivity curve of the resist material to optical exposure when the first acid generating agent is used according to Embodiment 1 of the present invention.

As shown at A in FIG. 1, a resist material according to Embodiment 1 of the present invention is prepared from a first acid generating agent 11 having a sensitivity only to an EB, a second acid generating agent 12 having a sensitivity to an optical beam, and an acid-decayed type resin 13 of a polymer principal chain 13a and a protecting group 13b (insoluble in a developer), as shown at A in FIG. 2. The sensitivities of the resist material to the EB and the optical beam when first and second acid generating agents 11 and 12 are used are shown in FIGS. 3 and 4, respectively.

Figure 5A:
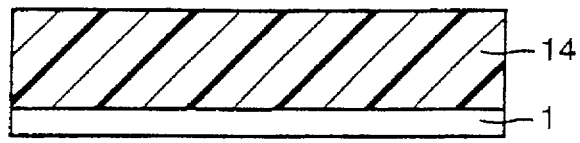
FIGS. 5A to 5D are diagrams showing the respective steps of a method for forming a resist pattern according to Embodiment 1 of the present invention.
Figure 5B:
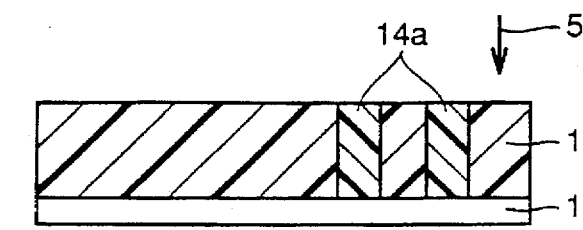

The steps of a method for forming a resist pattern using such a resist material prepared as described above are shown in FIGS. 5A to 5D and FIGS. 6A to 6C. The method for forming a resist pattern according to Embodiment 1 will be described hereinafter, also with reference to FIGS. 1 to 4. First, a resist material 14 is applied onto substrate 1, and pre-baked (FIG. 5A). Then, only a portion III to be patterned using EB lithography, that is, only a portion to be patterned by fine patterning, is exposed to EB5 with the amount of exposure of 10 to 100 μc/cm$^2$ (FIG. 5B). The amount of exposure at this time is within a range of a sensitivity of first acid generating agent 11 to the EB, that is, within a range I of a region in which a pattern can be formed, as shown in FIG. 3. In a portion 14a exposed to EB5 with this amount of exposure, Brønsted acid 15 is generated from first acid generating agent 11 as shown at B in FIG. 1.

Figure 5C:
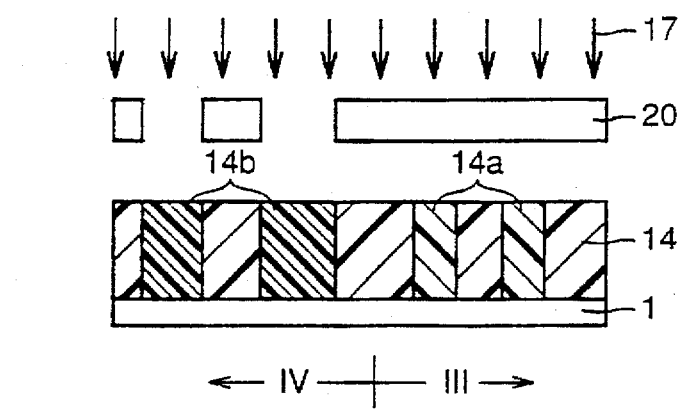

Then, a photomask 20 is formed masking the whole portion III to be patterned using the EB lithography as well as a portion IV to be patterned using optical beam lithography, that is, a predetermined portion of a portion to be patterned by patterning other than fine patterning, and the entire surface of the substrate is exposed to an optical beam 17 at a time with the amount of exposure of 10 to 1000 mJ/cm$^2$ (FIG. 5C). The amount of exposure at this time is within a range of a sensitivity of second acid generating agent 12 to the optical beam, that is, within a range I of a region in which a pattern can be formed, as shown in FIG. 4. In a portion 14b exposed to optical beam 17 with this amount of exposure, Brønsted acid 16 is generated from second acid generating agent 12 as shown at C in FIG. 1.

Figure 5D:
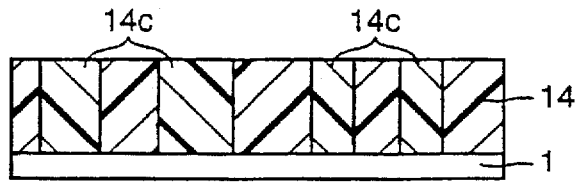
Figure 6A:
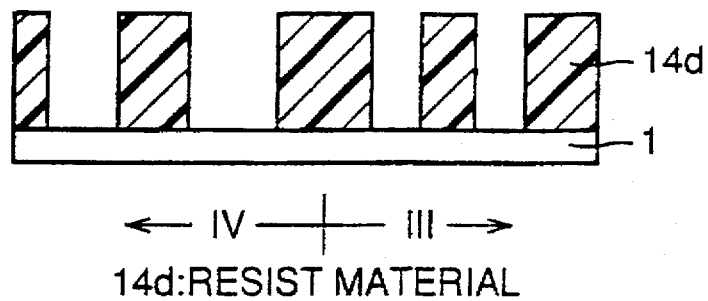
FIGS. 6A to 6C are diagrams showing the respective steps of the method for forming a resist pattern according to Embodiment 1 of the present invention.
Figure 6B:
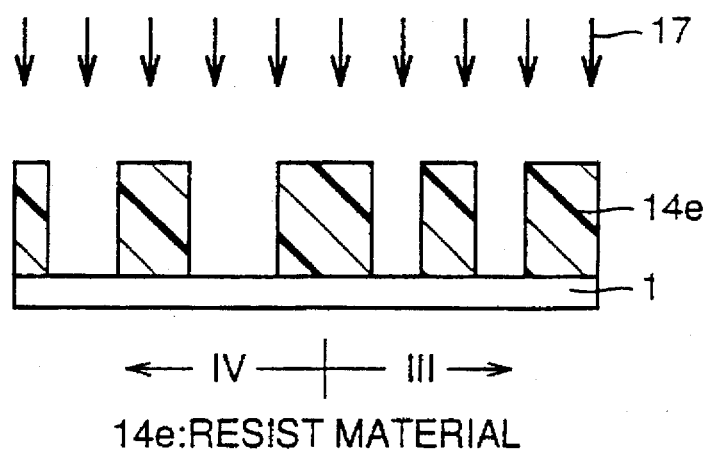
Figure 6C:
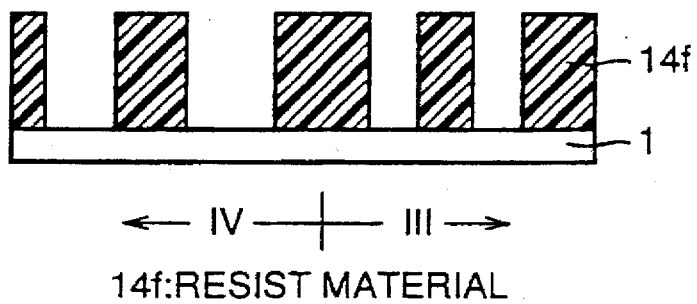
Figure 7A:
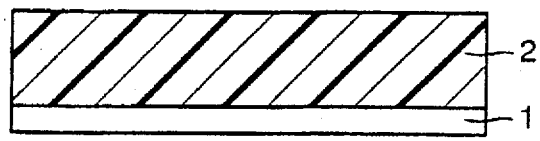
FIGS. 7A to 7F are diagrams showing the respective steps of a conventional method for forming a resist pattern.
Figure 7B:
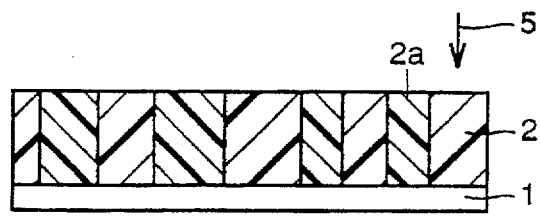
Figure 7C:
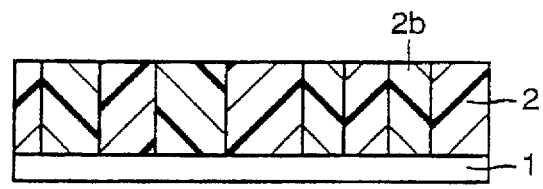
Figure 7D:
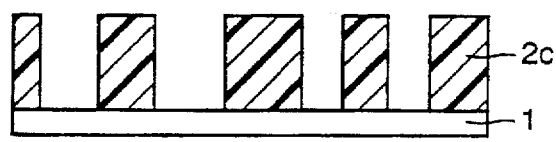
Figure 7E:
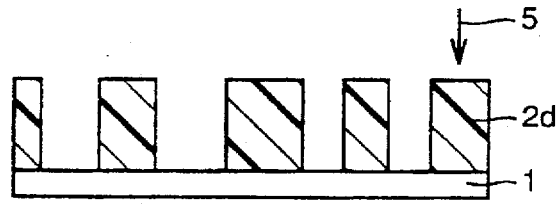
Figure 7F:
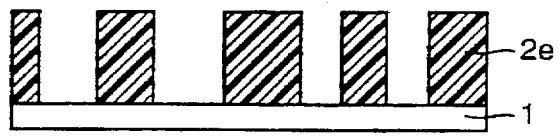
Figure 8:
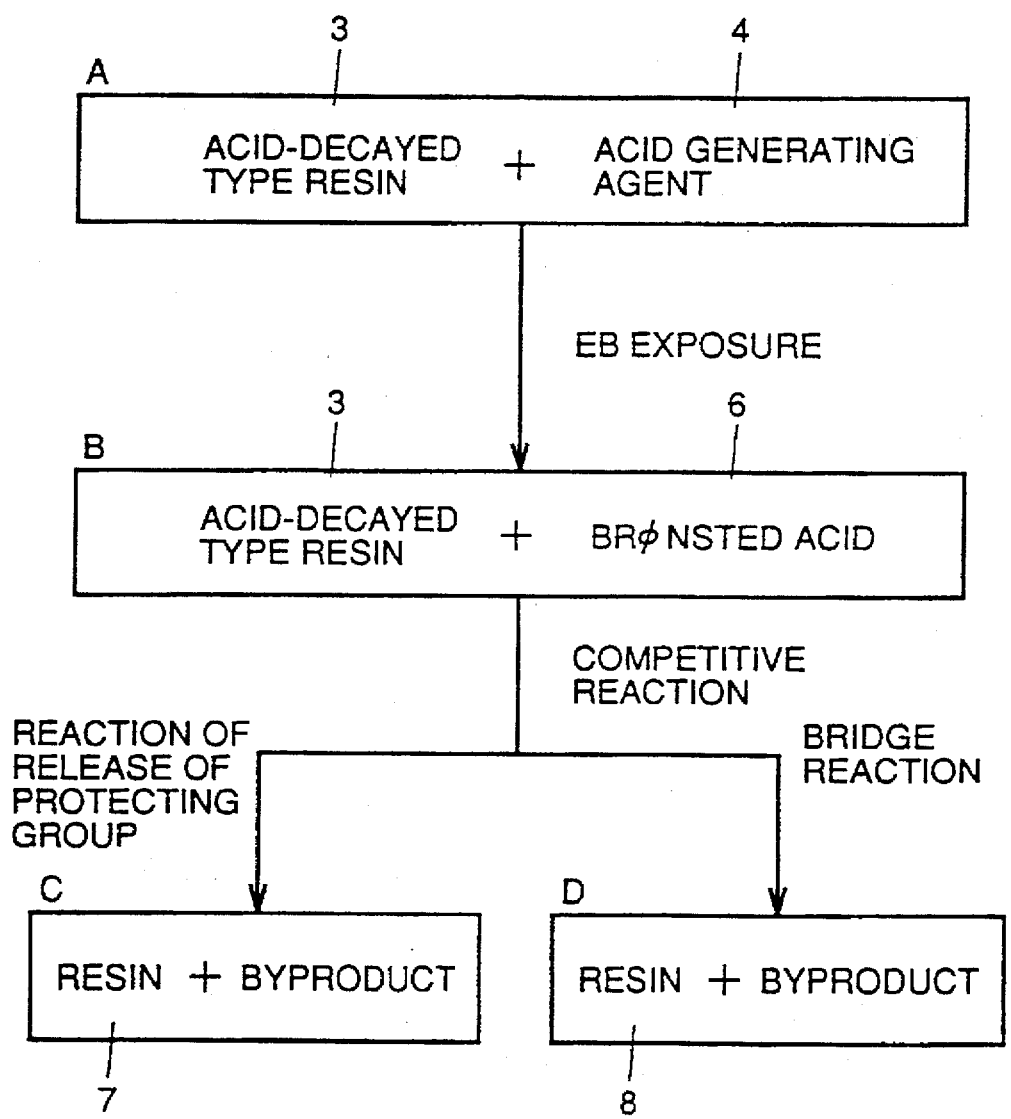
FIG. 8 is a diagram for describing change of a conventional resist material caused by the EB.
Figure 9A:
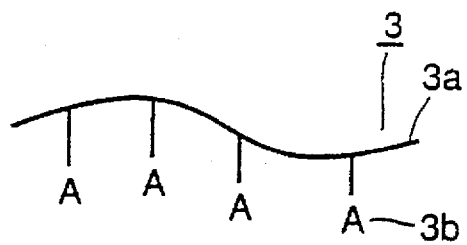
FIGS. 9A and 9B are diagrams showing structures of an acid-decayed type resin.
Figure 9B:
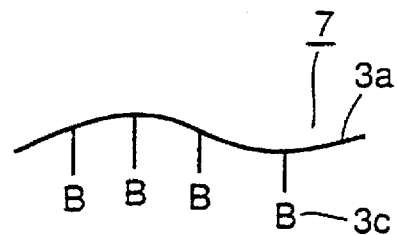
Figure 9C:
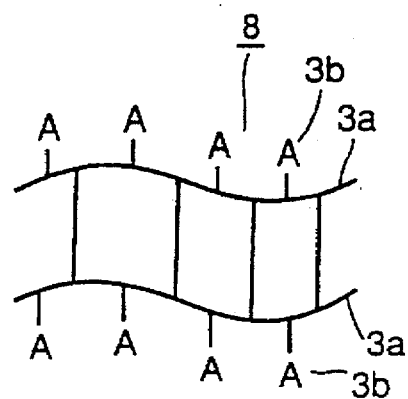
FIG. 9C is a diagram showing a structure of a resin which is made negative in FIG. 8.
Figure 10:
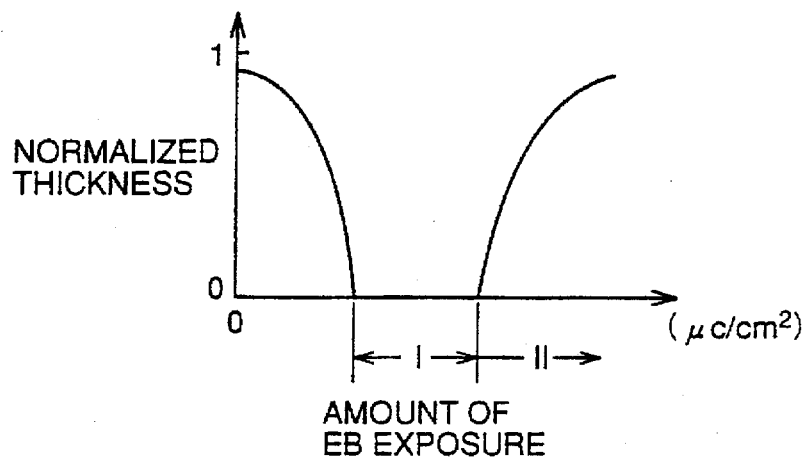
FIG. 10 is a diagram for describing a sensitivity curve of the resist material to EB exposure when a conventional acid generating agent is used.
Figure 11A:
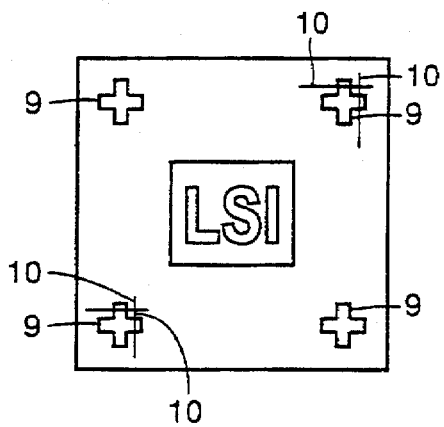
FIG. 11A and 11B are diagrams for describing degradation of a conventional alignment mark.
Figure 11B:
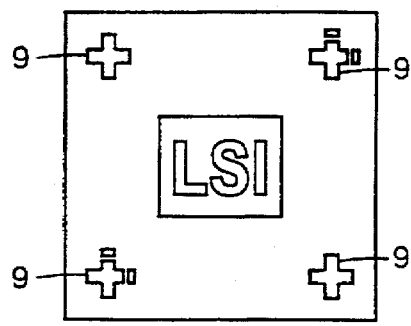

Then, a PEB treatment is carried out at a temperature of 80° to 100° C. for two to ten minutes, for example. As a result, resist materials 14a and 14b reacted by EB exposure and optical exposure are changed into resist material 14c which is soluble in a developer (FIG. 5D). More specifically, acid-decayed type resin 13 of resist material 14 is acid-decayed by Brønsted acid 15 or 16, and protecting group 13b is released to be changed into a substituent 13c (soluble in the developer), whereby the resist material is changed into a resin 18 which is soluble in the developer as shown at D in FIG. 1 and FIG. 2B. Then, the resist material is developed for 50 to 100 seconds, for example, in a developer such as an aqueous solution of tetramethylammonium by 2.38 wt %, resist material 14c soluble in the developer is removed, and patterned resist material 14d is formed (FIG. 6A). The entire surface of patterned resist material 14d is exposed at a time to optical beam 17 with the amount of exposure within a range greater than a range of a sensitivity of the resist material to the optical beam, that is, within a region II which can make the resist material negative as shown in FIG. 4 (FIG. 6B). In a portion 14e exposed to optical beam 17, Brønsted acid 16 is generated from second acid generating agent 12 as shown at C in FIG. 1. Then, the PEB treatment is carried out at a temperature of 80° to 100° C. for two to ten minutes, for example. As a result, resist material 14e reacted by optical exposure is changed into resist material 14f which is made negative (FIG. 6C). Although Brønsted acid 16 is generated from second acid generating agent 12 similarly to the case of the above-described optical exposure, the larger amount of exposure to optical beam 17 at this time increases the amount of generation of Brønsted acid 16, causing a bridge reaction as a competitive reaction of the reaction of releasing the protecting group FIG. 1. This in FIG. 1. This is the reason why the resist material is changed into a resin 19 which is made negative as shown in FIG. 2C. The etching resistance in the later steps is thus improved.

The resist material according to Embodiment 1 prepared as described above is reacted with first acid generating agent 11 at the time of exposure to EB5 and second acid generating agent 12 at the time of exposure to optical beam 17. Therefore, a pattern can be formed using both the EB lithography and the optical beam lithography, and resist material 14f which is made negative by exposure of the entire surface to optical beam 17 can be obtained. As a result, the throughput of the method for forming a resist pattern can be improved.

The portion III to be patterned using the EB lithography and the portion IV to be patterned using the optical beam lithography may be formed similarly even in the order opposite to the above.

Embodiment 2

In the above described Embodiment 1, the portion to be patterned by patterning other than fine patterning was included. When the portion to be patterned by patterning other than fine patterning is not included, a resist material similar to that of Embodiment 1 is patterned only with the EB lithography similar to that of Embodiment 1. Then, the patterned resist material can be made negative by exposing the entire surface to the optical beam at a time similarly to the case of Embodiment 1. In this case, although there is no improvement in throughput in patterning with the EB lithography, the entire throughput can be improved, because the resist material can be made negative in order to improve the etching resistance by exposing the entire surface to the optical beam at a time.

Embodiment 3

In each of the above embodiments, description was not given of registration of an alignment mark. Consider the case where registration of an alignment mark is carried out by the EB when the resist material of each of the above embodiments is used. The resist material is exposed to the EB with the EB lithography similarly to that of each of the above embodiments. Then, using a photomask exposing the alignment mark, such as a photomask exposing only a region of approximately 100 μm, for example, around the alignment mark, the entire surface is exposed to the optical beam with the amount of exposure within a region II which can make the resist material negative shown in FIG. 4. Then, the PEB treatment is carried out. Since the resist material on the alignment mark is made negative, the resist material scanned by the EB in registration of the alignment mark does not become soluble in the developer. Therefore, the alignment mark is not degraded in the later etching step. Note that the resist pattern can be formed similarly when the EB lithography and the step of exposing the entire surface to the optical beam at a time with the amount of exposure in the region II which can make the resist material negative are carried out in the opposite order.

Embodiment 4

In each of the above embodiments, an example was shown in which a resist material is formed of acid-decayed type resin 13 and first and second acid generating agents 11 and 12. However, the present invention is not limited thereto. The same effect can be obtained by forming the resist material of the acid-decayed type resin, an acid-decayed type dissolution inhibitor (which inhibits dissolution of the acid-decayed type resin in the developer before reaction, and loses the function of inhibiting dissolution after reaction with Brønsted acid, similarly to the acid-decayed type resin), and the first and second acid generating agents.

According to the one aspect of the present invention, a resist material includes a first acid generating agent having a sensitivity only to an EB and a second acid generating agent having a sensitivity to an optical beam. Therefore, both EB lithography and optical beam lithography can be used.

Since the resist material is prepared from an acid-decayed type resin and first and second acid generating agents, or the acid-decayed type resin, an acid-decayed dissolution inhibitor, and the first and second acid generating agents, the acid generating agents reliably acid-decay the acid-decayed type resin or the acid-decayed type resin and the acid-decayed type dissolution inhibitor to change the resist material into a resin which is soluble in a developer, so that the EB lithography and the optical beam lithography can reliably be used.

According to the another aspect of the present invention, a method for forming a resist pattern includes the steps of applying a resist material onto a substrate, exposing the resist material of a portion to be patterned using EB lithography to an EB with the amount of exposure within a range of a sensitivity of a first acid generating agent to the EB, exposing the resist material to an optical beam with the amount of exposure within a range of a sensitivity of a second acid generating agent to the optical beam using a photomask masking the entire surface of the portion to be patterned using the EB lithography as well as a predetermined portion of a portion to be patterned using optical beam lithography, and developing the resist material exposed to the EB and the optical beam after a PEB treatment. As a result, the resist material can be patterned with both EB exposure and optical exposure, resulting in improvement in throughput.

After exposing the developed resist material to the optical beam with the amount of exposure greater than that within a range of a sensitivity of the second acid generating agent to the optical beam, the PEB treatment is carried out. Therefore, the etching resistance of the resist material can be improved by exposure of the entire surface of the resist material to the optical beam at a time, resulting in improvement in throughput.

According to the still another aspect of the present invention, a resist material is applied onto a substrate. After exposing the resist material to an EB with the amount of exposure within a range of a sensitivity of a first acid generating agent to the EB to form a predetermined pattern, a PEB treatment is carried out to further develop the resist material. After exposing the developed resist material to an optical beam with the amount of exposure greater than that within a range of a sensitivity of a second acid generating agent to the optical beam, the PEB treatment is carried out. Therefore, even in patterning with the EB, the etching resistance of the resist material can be improved by exposure of the entire surface to the optical beam at a time, resulting in improvement in throughput.

According to the further aspect of the present invention, a resist material is applied onto a substrate. Registration of an alignment mark formed on the substrate is carried out using an EB. The resist material is exposed to the EB with the amount of exposure within a range of a sensitivity of a first acid generating agent to the EB to form a predetermined pattern. Using a photomask exposing the alignment mark, the resist material is exposed to an optical beam with the amount of exposure greater than that within a range of a sensitivity of a second acid generating agent to the optical beam. After carrying out a PEB treatment, the resist material exposed to the EB and the optical beam is developed. Therefore, the etching resistance of the resist material on the alignment mark can be improved by exposure of the entire surface to the optical beam at a time, resulting in improvement in throughput and prevention of degradation of the alignment mark.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A single layer of resist material, comprising:
   a first acid generating agent having a sensitivity only to an electron beam; and
   a second acid generating agent having a sensitivity to an optical beam.

2. The resist material according to claim 1, further comprising
   an acid-decayed type resin.

3. The resist material according to claim 1, further comprising
   an acid-decayed type resin and an acid-decayed type dissolution inhibitor.

4. A method for forming a resist pattern, which method comprises:
   applying onto a substrate a single layer of resist material containing a first acid generating agent having a sensitivity only to an electron beam and a second acid generating agent having a sensitivity to an optical beam;
   exposing a portion of said resist material to an electron beam at an exposure within the range of a sensitivity of the first acid generating agent to the electron beam;
   exposing said resist material to an optical beam through a photomask at an exposure within the range of a sensitivity of the second acid generating agent to the optical beam while masking the entire portion exposed to an electron beam;
   subjecting the exposed resist material to post-exposure baking; and
   developing said resist material after post-exposure baking.

5. The method according to claim 4, further comprising:
   exposing the resist material to the electron beam at an exposure of 10 to 100 $\mu c/cm^2$; and
   exposing the resist material to the optical beam at an exposure of 10 to 1000 $mJ/cm^2$.

6. The method according to claim 4, further comprising:
   carrying out post-exposure baking after exposing said developed resist material to the optical beam at an exposure exceeding the sensitivity of the second acid generating agent to the optical beam.

7. The method according to claim 4, comprising:
   post-exposure baking at a temperature of 80° to 100° C. for two to ten minutes.

8. The method according to claim 4, comprising:
   developing said resist material in an aqueous solution containing 2.38 wt % tetramethylammonium for 50 to 100 seconds.

9. A method for forming a resist pattern, which method comprises:
   applying onto a substrate a single layer of resist material containing a first acid generating agent having a sensitivity only to an electron beam and a second acid generating agent having a sensitivity to an optical beam;
   exposing said resist material to an electron beam at an exposure within the range of a sensitivity of the first acid generating agent to the electron beam to form a pattern, and then post-exposure baking to develop said resist material; and
   exposing said developed resist material to an optical beam at an exposure exceeding the sensitivity of the second acid generating agent to the optical beam, and then post-exposure baking.

10. The method according to claim 9, further comprising:
    exposing the resist material to the electron beam at an exposure of 10 to 100 $\mu c/cm^2$; and
    exposing the resist material to the optical beam at an exposure of 10 to 1000 $mJ/cm^2$.

11. The method according to claim 9, comprising:
    post-exposure baking at a temperature of 80° to 100° C. for two to ten minutes.

12. The method according to claim 9, comprising:
    developing said resist material in an aqueous solution containing 2.38 wt % tetramethylammonium for 50 to 100 seconds.

13. A method for forming a resist pattern, which method comprises:
    applying onto a substrate a single layer of resist material containing a first acid generating agent having a sensitivity only to an electron beam and a second acid generating agent having a sensitivity to an optical beam;
    registering an alignment mark formed on said substrate using an electron beam;
    exposing said resist material to an electron beam at an exposure with the range of a sensitivity of the first acid generating agent to the electron beam to form a pattern;

exposing said resist material to an optical beam at an exposure exceeding the sensitivity of the second acid generating agent to the optical beam through a photomask exposing said alignment mark;

post-exposure baking the exposed material; and developing said resist material after post-exposure baking.

14. The method according to claim 13, further comprising:

exposing the resist material to the electron beam at an exposure of 10 to 100 μc/cm$^2$; and exposing the resist material to the optical beam at an exposure of 10 to 1000 mJ/cm$^2$.

15. The method according to claim 13, comprising:

post-exposure baking at a temperature of 80° to 100° C. for two to ten minutes.

16. The method according to claim 13, comprising:

developing said resist material in an aqueous solution containing 2.38 wt % tetramethylammonium for 50 to 100 seconds.

17. The method according to claim 13, wherein the photomask exposes a region of 100 μm around said alignment mark.

* * * * *